(12) United States Patent
Fukuda et al.

(10) Patent No.: US 9,117,981 B2
(45) Date of Patent: Aug. 25, 2015

(54) SILICATE PHOSPHOR EXHIBITING HIGH LIGHT EMISSION CHARACTERISTICS AND MOISTURE RESISTANCE, AND LIGHT EMITTING DEVICE

(75) Inventors: Kouichi Fukuda, Ube (JP); Jin Amagai, Ube (JP); Seiji Noguchi, Ube (JP); Toru Inagaki, Ube (JP); Masaki Tanaka, Ube (JP)

(73) Assignee: UBE Material Industries, Ltd., Ube-shi, Yamaguchi (JP)

( * ) Notice: Subject to any disclaimer, the term of this patent is extended or adjusted under 35 U.S.C. 154(b) by 0 days.

(21) Appl. No.: 13/988,548

(22) PCT Filed: Nov. 22, 2011

(86) PCT No.: PCT/JP2011/076892
§ 371 (c)(1),
(2), (4) Date: Nov. 11, 2013

(87) PCT Pub. No.: WO2012/070565
PCT Pub. Date: May 31, 2012

(65) Prior Publication Data
US 2014/0054634 A1    Feb. 27, 2014

(30) Foreign Application Priority Data

Nov. 22, 2010 (JP) .................. 2010-260256
Nov. 22, 2010 (JP) .................. 2010-260257
Feb. 28, 2011 (JP) .................. 2011-042279
Oct. 5, 2011 (JP) .................. 2011-221080

(51) Int. Cl.
*H01L 33/00* (2010.01)
*H01L 33/50* (2010.01)
*H01L 33/44* (2010.01)
*C09K 11/77* (2006.01)

(52) U.S. Cl.
CPC .......... *H01L 33/504* (2013.01); *C09K 11/7734* (2013.01); *C09K 11/7792* (2013.01); *H01L 33/005* (2013.01); *H01L 33/44* (2013.01); *H01L 33/501* (2013.01); *H01L 33/502* (2013.01); *H01L 33/507* (2013.01); *H01L 2224/48091* (2013.01); *H01L 2224/73265* (2013.01)

(58) Field of Classification Search
CPC ... H01L 33/502; H01L 33/504; H01L 33/501; H01L 33/44; H01L 33/005
USPC ........................................... 257/100, 102
See application file for complete search history.

(56) References Cited

U.S. PATENT DOCUMENTS

| | | | |
|---|---|---|---|
| 6,555,958 B1 * | 4/2003 | Srivastava et al. | 313/506 |
| 2007/0241666 A1 * | 10/2007 | Jang et al. | 313/503 |
| 2009/0121608 A1 * | 5/2009 | Xie et al. | 313/364 |
| 2009/0289271 A1 * | 11/2009 | Tian et al. | 257/98 |
| 2010/0164346 A1 * | 7/2010 | Li et al. | 313/46 |
| 2010/0200874 A1 * | 8/2010 | Shioi et al. | 257/91 |
| 2011/0043101 A1 * | 2/2011 | Masuda et al. | 313/503 |
| 2012/0086034 A1 * | 4/2012 | Yuan et al. | 257/98 |
| 2012/0087103 A1 * | 4/2012 | Dai et al. | 362/84 |
| 2012/0087104 A1 * | 4/2012 | Dai et al. | 362/84 |

(Continued)

*Primary Examiner* — Ngan Ngo
(74) *Attorney, Agent, or Firm* — Nixon Peabody, LLC; Jeffrey L. Costellia (57) ABSTRACT

A silicate phosphor having a coating layer comprising a fluorine-containing compound on its surface which is obtained by a method of heating a mixture of 100 weight parts of a silicate phosphor and 0.5-15 weight parts of ammonium fluoride at a temperature in the range of 200 to 600° C. exhibits high light emission intensity and high moisture resistance.

14 Claims, 1 Drawing Sheet

(56) References Cited

U.S. PATENT DOCUMENTS

| | | |
|---|---|---|
| 2012/0087105 A1* | 4/2012 | Dai et al. .................... 362/84 |
| 2012/0112130 A1* | 5/2012 | Wu et al. ................ 252/301.4 P |
| 2012/0119234 A1* | 5/2012 | Shioi et al. ................... 257/88 |
| 2012/0138874 A1* | 6/2012 | Yuan et al. ................... 252/582 |
| 2012/0256533 A1* | 10/2012 | Seto et al. ................... 313/498 |
| 2013/0127332 A1* | 5/2013 | Chen et al. ................... 313/503 |
| 2014/0103373 A1* | 4/2014 | Li et al. ........................ 257/88 |

* cited by examiner

SILICATE PHOSPHOR EXHIBITING HIGH LIGHT EMISSION CHARACTERISTICS AND MOISTURE RESISTANCE, AND LIGHT EMITTING DEVICE

FIELD OF THE INVENTION

The present invention relates to a silicate phosphor showing excellent emission characteristics and high moisture resistance and a method for preparation of the same. The invention further relates to a light-emitting device employing the coated silicate phosphor as a visible light-emitting source.

BACKGROUND OF THE INVENTION

As phosphors emitting a visible light upon excitation with vacuum ultraviolet rays or ultraviolet rays, there are known silicate phosphors. For instance, there is known a blue light-emitting silicate phosphor having formula of $Sr_3MgSi_2O_8$:Eu, namely, a blue light-emitting SMS phosphor. There is also known a green light-emitting silicate phosphor having formula of $(Ba,Sr)_2SiO_4$:Eu. Further, there is known a red light-emitting silicate phosphor having formula of $Ba_3MgSi_2O_8$:Eu,Mn.

As light-emitting devices which emit a visible light from a phosphor excited with vacuum ultraviolet rays or ultraviolet rays, there are known an AC type plasma display panel (AC type PDP), a cold cathode fluorescent lamp (CCFL), and a white light-emitting diode (white light-emitting LED).

In the AC type PDP, vacuum ultraviolet rays produced by discharge of Xe gas are applied to all of the blue light-emitting phosphor, green light-emitting phosphor and red light-emitting phosphor, for producing a blue light, a green light and a red light. These lights are used to produce images. The emission produced by the discharge of Xe gas mainly comprises the Xe resonance emission and $Xe_2$ molecular beam emission. The resonance emission comprises vacuum ultraviolet rays having a center wavelength at 146 nm (or 147 nm, according to some texts). The molecular beam emission comprises ultraviolet rays having a center wavelength at 172 nm (or 173 nm, according to some texts).

In the CCFL, ultraviolet rays produced by discharge of Hg gas are applied to all of the blue light-emitting phosphor, green light-emitting phosphor and red light-emitting phosphor, for producing a blue light, a green light and a red light. These lights are mixed to give a white light. The ultraviolet rays produced by the discharge of Hg gas have wavelength at 254 nm.

Most of known white light-emitting LEDs comprise a light-emitting semiconductor element producing a blue light upon application of electric energy as well as a phosphor-containing resin composition comprising a yellow light-emitting phosphor dispersed in a resinous binder. In the white light-emitting LEDs, the blue light emitting from the semiconductor element and a yellow light emitting from the yellow light-emitting phosphor upon application of the blue light produced by the semiconductor element are mixed to give a white light. This white light-emitting system is called "dual color-mixing system". There is such problem, however, that the white light given by the dual color-mixing system is low in its color purity.

For the reason described above, a white light-emitting LED utilizing a triple color-mixing system has been developed. The white light-emitting LED according to this system employs a combination of a semiconductor element emitting an emission having a wavelength region of 350 to 430 nm upon application of electric energy and a phosphor-containing resin composition which comprises three kinds of phosphors, namely, a blue light-emitting phosphor, a green light-emitting phosphor and a red light-emitting phosphor, dispersed in a resinous binder such as epoxy resin or silicone resin. In this white light-emitting LED, the emission produced by the semiconductor element is applied to these phosphors and the blue light, green light and red light emitting from these phosphors are mixed to give a white light.

In the white light-emitting LED, silicate phosphors are employed. It is known, however, that the silicate phosphors are reactive with moisture, and hence are liable to decrease their emission strength upon contact with moisture. Therefore, it is desired to improve the moisture resistance of the silicate phosphors employed in the white light-emitting LED so as to keep them from decreasing their emission strength, which is caused by moisture permeated through the resinous binder.

There are a number of reports concerning the improvement of the moisture resistance of silicate phosphors in which the improvement is based on formation of a coating layer over the surface of the silicate phosphor.

D1 (JP 2011-68792 A) describes that the moisture resistance of a silicate phosphor can be improved by forming a moisture proof coating layer over the surface of the phosphor. The moisture proof coating layer comprises metal oxide particles dispersed in a metal oxide matrix phase, in which the metal oxide particles are plate-like particles having a particle size of 2 nm to 1 µm and a thickness of 100 nm or less under such condition that the thickness is less than ⅕ of the particle size.

D2 (JP 2002-539925 A) describes that inorganic material particles reactive with water can be made to have improved moisture resistance by forming a moisture impermeable-coating layer over the surfaces of the inorganic material particles. The moisture impermeable-coating layer can be formed by heating a mixture of the inorganic material particles or higher. The phosphor specifically mentioned in D2 to be improved in its moisture resistance is an alkaline earth metal aluminate. Further, the specification of D2 describes that ammonium fluoride to be calcined together with the phosphor is employed in an amount by weight of approx. 1:3 to 1:6, per the phosphor. The amount of ammonium fluoride employed corresponds to 16.7 to 33.3 weight parts, per 100 weight parts of the phosphor.

SUMMARY OF THE INVENTION

The inventors of the present invention have noted that it is not easy to form of a moisture proof layer containing the uniformly dispersed plate-like fine particles over the surface of phosphor, because it is rather difficult to uniformly disperse the plate-like particles in the moisture proof layer. In addition, if the plate-like particles aggregate in the coating layer, the coating layer shows reduced light transmission and hence the emission strength of the phosphor likely decreases.

As for the formation of the moisture proof layer over the surfaces of inorganic material particles by heating a mixture of inorganic material particles and ammonium fluoride, the inventors have found that, in the case that the inorganic material particles are silicate phosphor particles, if ammonium fluoride is employed in an amount exceeding 15 weight parts per 100 weight parts of the phosphor, the emission strength given by the phosphor sometimes decreases as compared with the phosphor with no coating.

Accordingly, the object of the invention is to provide appropriate technology to improve the moisture resistance of silicate phosphors without decreasing the emission strength of silicate phosphors.

The inventors have found that the moisture resistance of silicate phosphors can be improved without essential decrease of their emission strength, by heating a mixture of 100 weight parts of a silicate phosphor and 0.5 to 15 weight parts of ammonium fluoride to a temperature of 200 to 600° C. The invention has been made based on this finding.

It is understood that the improvement of moisture resistance of the silicate phosphor is caused by formation of a fluoride compound-containing coating layer ordinarily having a thickness in the range of 30 to 1,500 nm, wholly or partially over the surface of the silicate phosphor. The fluoride compound-containing coating material is produced upon contact of a thermal decomposition gas of ammonium fluoride mainly containing gaseous HF with the silicate phosphor.

Accordingly, the invention resides in a silicate phosphor having a coating layer comprising a fluorine-containing compound on its surface which is obtained by heating a mixture comprising a silicate phosphor and ammonium fluoride in an amount of 0.5 to 15 weight parts per 100 weight parts of the silicate phosphor at a temperature in the range of 200 to 600° C.

Preferred embodiments of the above-mentioned silicate phosphor having a coating layer comprising a fluorine-containing compound on its surface according to the invention are described below.

(1) The mixture comprises 1 to 10 weight parts of ammonium fluoride per 100 weight parts of the silicate phosphor.

(2) The silicate phosphor is selected from the group consisting of a blue light-emitting silicate phosphor having formula of $(Ba,Sr,Ca)_3MgSi_2O_8$:A in which A is an activating element, a green light-emitting silicate phosphor having formula of $(Ba,Sr,Ca)_2SiO_4$:B in which B is an activating element, and a red light-emitting silicate phosphor having formula of $(Ba,Sr,Ca)_3MgSi_2O_8$:Eu,Mn.

(3) The coated silicate phosphor emits a visible light in response to excitation with a light having a wavelength of 400 nm after being kept under the conditions at a temperature of 60° C., 90% RH, for 720 hours, said visible light having an emission peak at which the emission shows strength as much as 0.85 to 1.5 times the strength of emission given by the same silicate phosphor but having no coating layer after being kept under the same conditions.

The invention also resides in a method of preparing a silicate phosphor having a coating layer comprising a fluorine-containing compound on its surface, which comprises heating a mixture comprising a silicate phosphor and ammonium fluoride in an amount of 0.5 to 15 weight parts per 100 weight parts of the silicate phosphor at a temperature in the range of 200 to 600° C. The mixture preferably contains ammonium fluoride in an amount of 1 to 10 weight parts, per 100 weight parts of the silicate phosphor.

Further, the invention also resides in a silicate phosphor having a coating layer comprising a fluorine-containing compound, wherein the coating layer has thickness in the range of 30 to 1,500 nm.

Preferred embodiments of the above-mentioned silicate phosphor are described below.

(1) The silicate phosphor is a blue light-emitting silicate phosphor having formula of $(Ba,Sr,Ca)_3MgSi_2O_8$:A in which A is an activating element and the coating layer has thickness in the range of 30 to 150 nm.

(2) The silicate phosphor is a green light-emitting silicate phosphor having formula of $(Ba,Sr,Ca)_2SiO_4$:B in which B is an activating element and the coating layer has thickness in the range of 100 to 800 nm.

(3) The silicate phosphor is a red light-emitting silicate phosphor having formula of $(Ba,Sr,Ca)_3MgSi_2O_8$:Eu,Mn and the coating layer has thickness in the range of 30 to 300 nm.

Furthermore, the invention also resides in a light-emitting device comprising a semiconductor element emitting a light having the wavelength region of 350 to 430 nm and a phosphor-containing resin composition comprising a blue light-emitting phosphor, a green light-emitting phosphor and a red light-emitting phosphor, all of which emit the light in response to excitation with the light emitted by the semiconductor element, dispersed in a resinous binder, wherein at least the blue light-emitting phosphor is a silicate phosphor having a coating layer comprising a fluorine-containing compound on its surface which is obtained by heating a mixture comprising a silicate phosphor and ammonium fluoride in an amount of 0.5 to 15 weight parts per 100 weight parts of the silicate phosphor at a temperature in the range of 200 to 600° C.

Preferred embodiments of the light-emitting device of the invention are described below.

(1) The green light-emitting phosphor is also a silicate phosphor having a coating layer comprising a fluorine-containing compound on its surface which is obtained by heating a mixture comprising a silicate phosphor and ammonium fluoride in an amount of 0.5 to 15 weight parts per 100 weight parts of the silicate phosphor at a temperature in the range of 200 to 600° C.

(2) The red light-emitting phosphor is also a silicate phosphor having a coating layer comprising a fluorine-containing compound on its surface which is obtained by heating a mixture comprising a silicate phosphor and ammonium fluoride in an amount of 0.5 to 15 weight parts per 100 weight parts of the silicate phosphor at a temperature in the range of 200 to 600° C.

Furthermore, the invention also resides in a light-emitting device comprising a semiconductor element emitting a light having the wavelength region of 350 to 430 nm and a phosphor-containing resin composition comprising a blue light-emitting phosphor, a green light-emitting phosphor and a red light-emitting phosphor, all of which emit the light in response to excitation with the light emitted by the semiconductor element, dispersed in a resinous binder, wherein at least the blue light-emitting phosphor is a silicate phosphor having a coating layer comprising a fluorine-containing compound on its surface and the coating layer has thickness in the range of 30 to 1,500 nm.

Preferred embodiments of the above-mentioned light-emitting device are described below.

(1) The green light-emitting silicate phosphor also has a coating layer comprising a fluorine-containing compound on its surface and the coating layer has thickness in the range of 30 to 1,500 nm.

(2) The red light-emitting silicate phosphor also has a coating layer comprising a fluorine-containing compound on its surface and the coating layer has thickness in the range of 30 to 1,500 nm.

EFFECTS OF THE INVENTION

The silicate phosphor having a coating layer comprising a fluorine-containing compound according to the invention produces an emission having emission strength essentially equivalent to emission strength of the emission given by the same silicate phosphor having no coating layer, while decrease of strength of emission produced by the silicate phosphor having a coating layer after being kept under high humid conditions is less than decrease of strength of emission produced by the same silicate phosphor but having no coating layer after being kept under the same humid conditions. Accordingly, the coated silicate phosphor of the invention is of great value as a visible light source of a light-emitting device such as a white light-emitting LED in which the silicate phosphor is dispersed in resinous binder.

Further, the silicate phosphor of the invention which has a coating layer comprising a fluorine-containing compound shows improved heat resistance, as compared with the same silicate phosphor having no coating layer, as is apparent from the experimental data set forth hereinafter. In the light-emitting devices such as AC type PDP and CCFL, the phosphor is arranged on a substrate in the form of a phosphor layer. The phosphor layer is ordinarily produced by coating a phosphor dispersion on the substrate, drying the coated dispersion, and calcining the dried dispersion to a temperature of 200 to 600° C., particularly 300 to 600° C., under atmospheric conditions. The light-emitting device whose phosphor layer is produced in this manner sometimes shows lowering of emission characteristics in the course of the heat treatment of phosphor. In view of this fact, the silicate phosphor having a coating layer comprising a fluorine-containing compound according to the invention is also favorably employable as the visible light-emitting phosphor to be calcined in the formation of a phosphor layer in such light-emitting devices as AC type PDP and CCFL.

Further, the method of the invention is favorably employable for industrially producing the silicate phosphor having a coating layer comprising a fluorine-containing compound which is improved in heat resistance and moisture resistance.

Furthermore, the light-emitting device of the invention shows a stable high emission strength for a long period of time due to the high moisture resistance of the visible light-emitting phosphor.

EMBODIMENTS OF THE INVENTION

Figure 1:
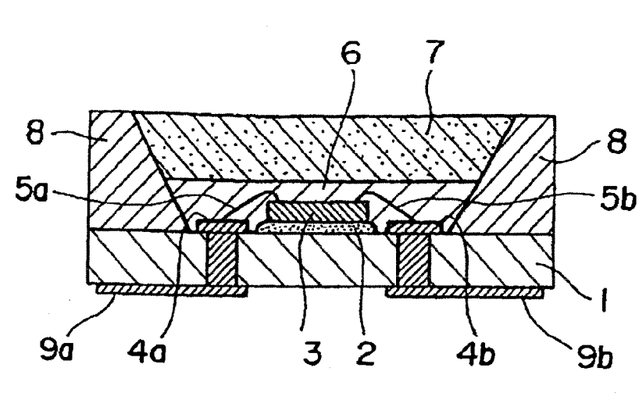
FIGURE is a sectional view of a light-emitting device according to the invention.

The silicate phosphor having a coating layer comprising a fluorine-containing compound according to the invention comprises a silicate phosphor and a coating layer which is placed on the surface of the silicate phosphor. The coating layer comprises a fluorine-containing compound. The silicate phosphor preferably is a silicate phosphor containing an alkaline earth metal. Examples of the alkaline earth metal-containing silicate phosphors include blue light-emitting silicate phosphors having formula of $(Ba,Sr,Ca)_3MgSi_2O_8$:A in which A is an activating element, green light-emitting silicate phosphors having formula of $(Ba,Sr,Ca)_2SiO_4$:B in which B is an activating element, and red light-emitting silicate phosphors having formula of $(Ba,Sr,Ca)_3MgSi_2O_8$:Eu,Mn.

In the blue light-emitting phosphors having formula of $(Ba,Sr,Ca)_3MgSi_2O_8$:A in which A is an activating element, A preferably contains Eu as main element. Eu is preferably contained in an amount of 0.001 to 0.2 mol per one mole of the phosphor. The activating element may contain Sc, Y, Gd, Tb and La. The blue light-emitting silicate phosphors preferably are an SMS phosphor having formula of $Sr_3MgSi_2O_8$:A and an SMS phosphor having formula of $(Sr,Ca)_3MgSi_2O_8$:A. These blue light-emitting SMS phosphors generally have a merwinite crystal structure.

The SMS phosphor having formula of $Sr_3MgSi_2O_8$:A preferably contains essentially no Ca and Ba. The description of "contains essentially no Ca and Ba" means the each of Ca and Ba is contained in an amount of 0.01 mol or less, per one mole of the SMS phosphor. The SMS phosphor having formula of $(Sr,Ca)_3MgSi_2O_8$:A preferably contains Sr and Ca in a molar ratio (Sr:Ca) of generally 1:0.10 to 1:0.30, preferably 1:0.13 to 1:0.23.

In the green light-emitting phosphors having formula of $(Ba,Sr,Ca)_2SiO_4$:B in which B is an activating element, B preferably contains Eu as main element. Eu is preferably contained in an amount of 0.001 to 0.2 mol per one mole of the phosphor. The activating element may contain Cr, Mn, Sm, Tm, and Yb. Preferred is a phosphor having formula of $(Ba,Sr)_2SiO_4$:Eu.

The red light-emitting phosphor having formula of $(Ba,Sr,Ca)_3MgSi_2O_8$:Eu,Mn preferably is a phosphor having $Ba_3MgSi_2O_8$:Eu,Mn.

The fluorine compound-containing coating layer of the coated silicate phosphor according to the invention contains fluorine in an amount of 20 atomic % or more. The amount of fluorine is expressed by percentage of number of fluorine atoms per number of whole atoms contained in the coating layer comprising a fluorine-containing compound. The upper limit of the amount of fluorine contained in the coating layer generally is 90 atomic %.

The coating layer comprising a fluorine-containing compound has a thickness ordinarily in the range of 30 to 1,500 nm, preferably in the range of 50 to 1,500 nm, more preferably in the range of 100 to 800 nm. In the case that the silicate phosphor is a blue light-emitting phosphor having formula of $(Ba,Sr,Ca)_3MgSi_2O_8$:A, the coating layer preferably has a thickness in the range of 30 to 150 nm. In the case that the silicate phosphor is a green light-emitting phosphor having formula of $(Ba,Sr,Ca)_2SiO_4$:B, the coating layer preferably has a thickness in the range of 100 to 800 nm. In the case that the silicate phosphor is a red light-emitting phosphor having formula of $(Ba,Sr,Ca)_3MgSi_2O_8$:Eu,Mn, the coating layer preferably has a thickness in the range of 30 to 300 nm.

In the case that the silicate phosphor contains an alkaline earth metal, the coating layer preferably contains an alkaline earth metal fluoride. For instance, in the case that the silicate phosphor is a blue light-emitting SMS phosphor, the coating layer preferably contains $SrF_2$. In the case that the silicate phosphor is a green light-emitting phosphor having formula of $(Ba,Sr)_2SiO_4$:Eu, the coating layer preferably contains $(Ba,Sr)F_2$. In the case that the silicate phosphor is a red light-emitting phosphor having formula of $Ba_3MgSi_2O_8$:Eu, Mn, the coating layer preferably contains $BaF_2$.

The coating layer comprising a fluorine-containing compound can be produced by a procedure of heating a mixture of a silicate phosphor and ammonium fluoride. In other words, the procedure is performed by heating a silicate phosphor in the presence of ammonium fluoride. In the mixture, ammonium fluoride is present ordinarily in an amount of 0.5 to 15 weight parts, preferably in an amount of 1 to 10 weight parts, per 100 weight parts of the silicate phosphor. The mixture is heated ordinarily to a temperature in the range of 200 to 600° C., preferably in the range of 200 to 500° C., more preferably in the range of 200 to 480° C., most preferably in the range of 300 to 480° C. The mixture is heated ordinarily for 1 to 5 hours.

The mixture is heated preferably under atmospheric conditions or in nitrogen gas atmosphere or argon gas atmosphere. Preferably, the mixture is heated under atmospheric conditions. The mixture may be heated in a heat-resistant crucible such as ceramic crucible preferably on which a lid is placed. The thermal decomposition of ammonium fluoride proceeds at a relatively low temperature. Therefore, the coating layer comprising a fluorine-containing compound is formed on the surface of the silicate phosphor before the silicate phosphor is so heated as to show lowering the emission strength even if the heating is performed under atmospheric conditions. Therefore, the emission strength does not lower.

The coated silicate phosphor of the invention shows improved moisture resistance and heat resistance, as compared with the same silicate phosphor having no coating layer. The improved moisture resistance means that the phosphor does not show substantial decrease of emission strength (emission characteristics) upon it is brought into contact with moisture.

The coated silicate phosphor of the invention emits a visible light in response to excitation with a light having a wavelength of 400 nm after being kept under such conditions as 720 hours, at 60° C., 90% RH, said visible light having an emission peak at which the emission shows strength ordinarily as much as 0.85 to 1.5 times, preferably as much as 0.90 to 1.5 times, the strength of emission given by the same silicate phosphor but having no coating layer after being kept under the same conditions, that is, the phosphor having no coating layer is kept under such conditions as 720 hours, at 60° C., 90% RH.

The coated silicate phosphor of the invention shows improved heat resistance, as compared with the same silicate phosphor having no coating layer. The improvement of heat resistance means that the decrease of emission strength (emission characteristics) observed when a phosphor is heated under atmospheric condition is substantially obviated. The comparison of decrease of emission strength at the emission peak observed after heating the phosphor to 500° C. for 30 minutes between the coated phosphor and the same phosphor having no coating layer shows that the emission strength observed on the coated phosphor is ordinarily 1.05 times or more, particularly 1.05 to 2.00 times, sometimes 1.10 to 1.80 times (depending on the conditions), as much as the emission strength observed on the same phosphor having no coating layer.

The light-emitting device of the invention is described below referring to the sectional view shown in FIGURE.

FIGURE is a sectional view of an example of the light-emitting device of the invention. The light-emitting device shown in FIGURE is a white light-emitting LED employing the triple color mixing system. In FIGURE, the white light-emitting LED comprises substrate 1, light-emitting semiconductor element 3 fixed on the substrate 1 via adhesive 2, a pair of electrodes 4a,4b formed on the substrate 1, lead wires 5a,5b electrically connecting the semiconductor element 3 to the electrodes 4a,4b, resinous layer 6 coating the semiconductor element 3, phosphor-containing resin composition layer 7 placed on the resinous layer 6, light reflection material 8 surrounding both of the resinous layer 6 and phosphor-containing resin composition layer 7, and conductive wires 9a,9b connecting the electrodes 4a,4b to outside electric source (not shown).

The substrate 1 preferably has high insulating property and high heat conductivity. Examples of the substrate 1 include a substrate of ceramic material such as alumina or aluminum nitride and a resinous substrate containing particles of inorganic material such as metal oxide or ceramic glass.

The light-emitting semiconductor element 3 preferably emits a light having wavelength in the region of 350 to 430 nm by application of electric energy. Examples of the semiconductor element 3 include a light-emitting AlGaN semiconductor element.

The resinous layer 6 is made of transparent resin. Examples of the transparent resin include epoxy resin and silicone resin.

The phosphor-containing resin composition layer 7 comprises a blue light-emitting phosphor, a green light-emitting phosphor and a red light-emitting phosphor dispersed in the resinous binder. Each of the blue light-emitting phosphor, green light-emitting phosphor and red light-emitting phosphor preferably is a silicate phosphor having a coating layer comprising a fluorine-containing compound. The resinous binder is transparent resin such as epoxy resin or silicone resin.

The light-reflecting material 8 reflects the visible light emitting from the phosphor-containing resin composition layer 7 so as to advance to outside, and hence the emission taken out of the light-emitting device is increased. The light-reflecting material 8 can be made of a metal such as Al, Ni, Fe, Cr, Ti, Cu, Rh, Ag, Au and Pt, a metal compound such as alumina, zirconia, titania, magnesia, zinc oxide and calcium carbonate, or a resinous material containing white pigment.

In the white light-emitting device of FIGURE, when an electric voltage is applied to electrodes 4a,4b via electroconductive wires 9a, 9b, the light-emitting semiconductor element 3 emits a light having a emission peak in the wavelength region of 350 to 430 nm. The emission then excites the phosphors contained in the phosphor layer 7, whereby visible lights in the blue light region, green light region, and red light region are produced. These lights mix to give a white light.

The white light-emitting LED can be manufactured by the following procedures. The patterned electrodes 4a, 4b are formed on the substrate 1. Subsequently, the light-emitting semiconductor element 3 is fixed on the substrate 1 using an adhesive 2. The semiconductor element 3 and the electrodes 4a,4b are connected by lead wires 5a,5b by way of the wire bonding procedure. Around the semiconductor element 3 is fixed the light-reflecting material 8. Then, a transparent resin material is spread over the semiconductor element 3, and the spread resin material is cured to form a resinous layer 6. On the resinous layer 6 is spread a phosphor-containing resin composition, and the spread resin composition is cured, to give the phosphor-containing resin composition layer 7.

It is known that a white light-emitting LED has a phosphor-containing glass composition layer in place of the phosphor-containing resin composition layer 7. The coated silicate phosphor of the invention is also employable for the formation of the phosphor-containing glass composition layer.

The white light-emitting LED may employ phosphors other than the silicate phosphor. Examples of red light-emitting phosphors other than silicate phosphor include $Y_2O_2S:Eu^{2+}$, $La_2O_3S:Eu^{2+}$, $(Ca,Sr,Ba)_2Si_5N_8:Eu^{2+}$, $CaAlSiN_2:Eu^{2+}$, $Eu_2W_2O_9$, $(Ca,Cr,Ba)_2Si_5N_8:Eu^{2+}$, $CaTiO_3:Pr^{3+},Bi^{3+}$, and $(La,Eu)_2W_3O_{22}$. Examples of green light-emitting phosphors other than the silicate phosphor include $BaMgAl_{10}O_{17}:Eu^{2+}$, $Mn^{2+}$, $\alpha$-SiAlON:$Eu^{2+}$, $\beta$-SiAlOn:$Eu^{2+}$ and ZnS:Cu, Al.

EXAMPLES

In the following Examples and Comparison Examples, the emission strength of the silicate phosphor was determined by the below-described procedure.

[Determination of Emission Strength of Silicate Phosphor]

The silicate phosphor is excited by applying radiation thereto, and the emission spectrum is obtained. The emission strength is determined by measuring the height of the maximum peak in the emission spectrum. When the radiation is a vacuum ultraviolet ray having a wavelength of 146 nm or 172 nm, the light source is an eximer lamp. When the radiation is a ultraviolet ray having a wavelength of 254 nm or 400 nm, the light source is a xenon lamp.

Example 1

Production of Blue Light-Emitting SMS Phosphor Having Coating Layer Comprising Fluorine-Containing Compound, and Evaluation on its Heat Resistance (1) Preparation of Blue Light-Emitting SMS Phosphor Powdery strontium carbonate (purity: 99.99 wt. %, mean particle size: 2.73 μm), powdery magnesium oxide (prepared by gas phase oxidation, purity: 99.98 wt. %, BET specific surface area: 8 m$^2$/g), powdery silicon dioxide (purity: 99.9 wt. %, mean particle size: 3.87 μm), powdery europium oxide (purity: 99.9 wt. %, mean particle size: 2.71 μm), and powdery strontium chloride (purity: 99.9 wt. %) were taken in the molar ratio of 2.845:1:2.000:0.015:0.125 for $SrCO_3$:MgO:$SiO_2$:$Eu_2O_3$:$SrCl_2$, respectively. The mean particle size of each powder was determined by the laser diffraction scattering method.

All of the powdery materials were placed in a ball mill together with pure water and mixed under wet conditions for 24 hours, to give a slurry of the powdery mixture. The slurry was dried by means of a spray dryer to obtain a powdery mixture having a mean particle size of 40 μm. The obtained powdery mixture was washed with water, and dried. The dry powdery mixture was placed in an alumina crucible and calcined by heating to 800° C. for 3 hours under atmospheric conditions. The calcined mixture was allowed to stand at room temperature. The mixture was then calcined by heating to 1,200° C. for 6 hours in an atmosphere of a gaseous mixture of 2 vol. % hydrogen-98 vol. % argon. The calcined mixture was allowed to stand at room temperature, to give a powdery calcined product. The powdery calcined product was washed with water and dried.

X ray diffraction pattern of the dried powdery calcined product indicated that the calcined product had a merwinite crystal structure. Further, it was confirmed that the calcined product emits a blue light upon irradiation of lights having wavelengths of 146 nm, 172 nm, 254 nm and 400 nm, respectively.

Accordingly, it was confirmed that the calcined product was a blue light-emitting SMS phosphor having a constitutional formula of $Sr_{2.97}MgSi_2O_8$:$Eu^{2+}_{0.03}$. The SMS phosphor was excited with a radiation having wavelength of 146 nm, 172 nm, 254 nm or 400 nm, respectively, and the emission strength was determined. The emission strength determined here was named an initial emission strength.

(2) Heat Treatment in the Presence of Ammonium Fluoride (Formation of Coating Layer Comprising Fluorine-Containing Compound)

100 weight parts of the SMS phosphor prepared in (1) above were mixed with 0.5 weight part of ammonium fluoride. The mixture was placed in an alumina crucible. The crucible was covered with a lid, and heated to 400° C. for 3 hours under atmospheric conditions, and allowed to stand at room temperature. The emission strength of the obtained SMS phosphor was determined in the above-mentioned manner using vacuum ultraviolet rays having wavelengths of 146 nm and 172 nm (which was mainly utilized in the AC type PDP, respectively. The results are set forth in Table 1, in which the emission strength is described by a value relative to 100 for the initial emission strength determined in (1) above.

(3) Heat Treatment Under Atmospheric Conditions (Evaluation on Heat Resistance)

The SMS phosphor having been subjected to the heat treatment in (2) above was placed in an alumina crucible and heated to 500° C. for 30 minutes under atmospheric conditions. The heated SMS phosphor was allowed to stand at room temperature. Subsequently, the emission strength of the SMS phosphor was determined by exciting with vacuum ultraviolet rays having wavelengths of 146 nm and 172 nm, respectively. The results are set forth in Table 1, in which the emission strength is described by a value relative to 100 for the initial emission strength determined in (1) above.

Example 2

Production of Blue Light-Emitting SMS Phosphor Having Coating Layer Comprising Fluorine-Containing Compound, and Evaluation on its Heat Resistance The procedures of Example 1 were repeated except that ammonium fluoride was used in an amount of 5.0 weight parts per 100 weight parts of the SMS phosphor in the procedures of (2) for heat treatment in the presence of ammonium fluoride. The thus heat treated SMS phosphor was further heated under atmospheric conditions in the manner described in (3).

Each of the SMS phosphor heated in the presence of ammonium fluoride and the SMS phosphor heated under atmospheric conditions was excited with vacuum ultraviolet rays having wavelengths of 146 nm and 172 nm, respectively, in the same manner as described above. The results are set forth in Table 1.

Example 3

Production of Blue Light-Emitting SMS Phosphor Having Coating Layer Comprising Fluorine-Containing Compound, and Evaluation on its Heat Resistance The procedures of Example 1 were repeated except that ammonium fluoride was used in an amount of 10.0 weight parts per 100 weight parts of the SMS phosphor in the procedures of (2) for heat treatment in the presence of ammonium fluoride. The thus heat treated SMS phosphor was further heated under atmospheric conditions in the manner described in (3).

The SMS phosphor heated under atmospheric conditions was excited with vacuum ultraviolet rays having wavelengths of 146 nm and 172 nm, respectively, in the same manner as described above. The results are set forth in Table 1.

Comparison Example 1

Evaluation on Heat Resistance of Blue Light-Emitting SMS Phosphor Having No Coating Layer The procedures of Example 1 were repeated except that the procedures of (2) for heat treatment in the presence of ammonium fluoride were omitted. The SMS phosphor was heated under atmospheric conditions in the manner described in (3).

Each of the SMS phosphor heated in the presence of ammonium fluoride and the SMS phosphor heated under atmospheric conditions was excited with vacuum ultraviolet rays having wavelengths of 146 nm and 172 nm, respectively, in the same manner as described above. The results are set forth in Table 1.

Comparison Example 2

Production of Blue Light-Emitting SMS Phosphor Having Coating Layer Comprising Fluorine-Containing Compound, and Evaluation on its Heat Resistance The procedures of Example 1 were repeated except that ammonium fluoride was used in an amount of 20.0 weight parts per 100 weight parts of the SMS phosphor in the procedures of (2) for heat treatment in the presence of ammonium fluoride. The thus heat treated SMS phosphor was further heated under atmospheric conditions in the manner described in (3).

Each of the SMS phosphor heated in the presence of ammonium fluoride and the SMS phosphor heated under atmospheric conditions was excited with vacuum ultraviolet rays having wavelengths of 146 nm and 172 nm, respectively, in the same manner as described above. The results are set forth in Table 1.

Comparison Example 3

Production of Blue Light-Emitting SMS Phosphor Having Coating Layer Comprising Fluorine-Containing Compound, and Evaluation on its Heat Resistance The procedures of Example 1 were repeated except that ammonium fluoride was used in an amount of 30.0 weight parts per 100 weight parts of the SMS phosphor in the procedures of (2) for heat treatment in the presence of ammonium fluoride. The thus heat treated SMS phosphor was further heated under atmospheric conditions in the manner described in (3).

Each of the SMS phosphor heated in the presence of ammonium fluoride and the SMS phosphor heated under atmospheric conditions was excited with vacuum ultraviolet rays having wavelengths of 146 nm and 172 nm, respectively, in the same manner as described above. The results are set forth in Table 1.

TABLE 1

(wavelength of exciting light, 146 nm, 172 nm, for PDP)

| | Amount of $NH_4F$ | Emission strength | | | |
|---|---|---|---|---|---|
| | | First heating | | Second heating | |
| | | Exciting light | | | |
| | (weight part(s)) | 146 nm | 172 nm | 146 nm | 171 nm |
| Example 1 | 0.5 | 104 | 105 | 81 | 100 |
| Example 2 | 5.0 | 103 | 102 | 101 | 104 |
| Example 3 | 10.0 | 104 | 110 | 98 | 106 |
| Com. Ex. 1 | — | (100) | (100) | 63 | 89 |
| Com. Ex. 2 | 20.0 | 69 | 103 | 74 | 100 |
| Com. Ex. 3 | 30.0 | 61 | 99 | 75 | 101 |

Remarks:
First heating: Emission strength after heat treatment in the presence of ammonium fluoride ($NH_4F$)

Second heating: Emission strength after heat treatment under atmospheric conditions Amount of $NH_4F$ shown is per 100 weight parts of SMS phosphor.

Emission strength is a value relative to 100 of the initial emission strength (emission strength observed on the SMS phosphor is that observed before heat treatment in the presence of ammonium fluoride).

The emission strength indicated for Comparison Example 1 in parenthesis is that determined before the heat treatment under atmospheric conditions.

As is clear from the results shown in Table 1, each of the SMS phosphors (Examples 1 to 3) which were heat-treated in the presence of ammonium fluoride according to the invention gives an emission of high emission strength under excitation with each light having wavelengths of 146 nm and 172 nm after heat treatment under atmospheric conditions, as compared with the SMS phosphor (Comparison Example 1) having been not heat-treated in the presence of ammonium fluoride. On the other hands, the results of Comparison Examples 2 and 3 indicate that the heat treatment of SMS phosphor in the presence of an excessively large amount of ammonium fluoride is disadvantageous because the emission strength observed after the heat treatment in the presence of ammonium fluoride largely decreases concerning the emission strength shown upon excitation with the light having the wavelength of 146 nm.

Example 4

Production of Blue Light-Emitting SMS Phosphor Having Coating Layer Comprising Fluorine-Containing Compound, and Evaluation on its Heat Resistance The procedures of Example 1 were repeated except that ammonium fluoride was used in an amount of 1.0 weight parts per 100 weight parts of the SMS phosphor in the procedures of (2) for heat treatment in the presence of ammonium fluoride. The thus heat treated SMS phosphor was further heated under atmospheric conditions in the manner described in (3).

Each of the SMS phosphor heated in the presence of ammonium fluoride and the SMS phosphor heated under atmospheric conditions was excited with ultraviolet rays having wavelengths of 254 nm (which was mainly utilized in CCFL), in the same manner as described above. The results are set forth in Table 2.

Example 5

Production of Blue Light-Emitting SMS Phosphor Having Coating Layer Comprising Fluorine-Containing Compound, and Evaluation on its Heat Resistance The procedures of Example 1 were repeated except that ammonium fluoride was used in an amount of 2.5 weight parts per 100 weight parts of the SMS phosphor in the procedures of (2) for heat treatment in the presence of ammonium fluoride. The thus heat treated SMS phosphor was further heated under atmospheric conditions in the manner described in (3).

Each of the SMS phosphor heated in the presence of ammonium fluoride and the SMS phosphor heated under atmospheric conditions was excited with ultraviolet rays having wavelengths of 254 nm and 400 nm (which was mainly utilized in white light-emitting devices), respectively, in the same manner as described above. The results are set forth in Tables 2 and 3.

Example 6

Production of Blue Light-Emitting SMS Phosphor Having Coating Layer Comprising Fluorine-Containing Compound, and Evaluation on its Heat Resistance The procedures of Example 1 were repeated except that ammonium fluoride was used in an amount of 4.0 weight parts per 100 weight parts of the SMS phosphor in the procedures of (2) for heat treatment in the presence of ammonium fluoride. The thus heat treated SMS phosphor was further heated under atmospheric conditions in the manner described in (3).

Each of the SMS phosphor heated in the presence of ammonium fluoride and the SMS phosphor heated under atmospheric conditions was excited with ultraviolet rays having wavelengths of 254 nm and 400 nm, respectively, in the same manner as described above. The results are set forth in Tables 2 and 3.

Example 7

Production of Blue Light-Emitting SMS Phosphor Having Coating Layer Comprising Fluorine-Containing Compound, and Evaluation on its Heat Resistance The procedures of Example 1 were repeated except that ammonium fluoride was used in an amount of 7.0 weight parts per 100 weight parts of the SMS phosphor in the procedures of (2) for heat treatment in the presence of ammonium fluoride. The thus heat treated SMS phosphor was further heated under atmospheric conditions in the manner described in (3).

Each of the SMS phosphor heated in the presence of ammonium fluoride and the SMS phosphor heated under atmospheric conditions was excited with ultraviolet rays having wavelengths of 254 nm and 400 nm, respectively, in the same manner as described above. The results are set forth in Tables 2 and 3.

Example 8

Production of Blue Light-Emitting SMS Phosphor Having Coating Layer Comprising Fluorine-Containing Compound, and Evaluation on its Heat Resistance The procedures of Example 1 were repeated except that ammonium fluoride was used in an amount of 10.0 weight parts per 100 weight parts of the SMS phosphor in the procedures of (2) for heat treatment in the presence of ammonium fluoride. The thus heat treated SMS phosphor was further heated under atmospheric conditions in the manner described in (3).

Each of the SMS phosphor heated in the presence of ammonium fluoride and the SMS phosphor heated under atmospheric conditions was excited with ultraviolet rays having wavelengths of 254 nm and 400 nm, respectively, in the same manner as described above. The results are set forth in Tables 2 and 3.

Comparison Example 4

Evaluation on Heat Resistance of Blue Light-Emitting SMS Phosphor Having No Coating Layer The procedures of Example 1 were repeated except that the procedures of (2) for heat treatment in the presence of ammonium fluoride was omitted. The SMS phosphor was heated under atmospheric conditions in the manner described in (3).

The SMS phosphor heated under atmospheric conditions was excited with vacuum ultraviolet rays having wavelengths of 254 nm and 400 nm, respectively, in the same manner as described above. The results are set forth in Tables 2 and 3.

TABLE 2

| (wavelength of exciting light, 254 nm, for CCFL) | | | |
|---|---|---|---|
| | Amount of $NH_4F$ | Emission strength | |
| | (weight part(s)) | First heating | Second heating |
| Example 4 | 1.0 | 86 | 90 |
| Example 5 | 2.5 | 100 | 100 |
| Example 6 | 4.0 | 100 | 100 |
| Example 7 | 7.0 | 95 | 94 |
| Example 8 | 10.0 | 90 | 90 |
| Com. Ex. 4 | — | (100) | 72 |

Remarks:

First heating: Emission strength after heat treatment in the presence of ammonium fluoride ($NH_4F$)

Second heating: Emission strength after heat treatment under atmospheric conditions Amount of $NH_4F$ shown is per 100 weight parts of SMS phosphor.

Emission strength is a value relative to 100 of the initial emission strength (emission strength observed on the SMS phosphor is that observed before heat treatment in the presence of ammonium fluoride).

The emission strength indicated for Comparison Example 1 in parenthesis is that determined before the heat treatment under atmospheric conditions.

As is clear from the results shown in Table 2, each of the SMS phosphors (Examples 4 to 8) which were heat-treated in the presence of ammonium fluoride according to the invention gives an emission of high emission strength under excitation with ultraviolet rays having wavelength of 254 nm after heat treatment under atmospheric conditions, as compared with the SMS phosphor (Comparison Example 4) having been not heat-treated in the presence of ammonium fluoride.

TABLE 3

| (wavelength of exciting light, 400 nm, for white light emitting LED) | | | |
|---|---|---|---|
| | Amount of $NH_4F$ | Emission strength | |
| | (weight part(s)) | First heating | Second heating |
| Example 5 | 2.5 | 100 | 100 |
| Example 6 | 4.0 | 101 | 101 |
| Example 7 | 7.0 | 101 | 101 |
| Example 8 | 10.0 | 100 | 100 |
| Com. Ex. 4 | — | (100) | 80 |

Remarks:

First heating: Emission strength after the heat treatment in the presence of ammonium fluoride ($NH_4F$)

Second heating: Emission strength after the heat treatment under atmospheric conditions Amount of $NH_4F$ shown is per 100 weight parts of SMS phosphor.

Emission strength is a value relative to 100 of the initial emission strength which was observed prior to heat treatment in the presence of ammonium fluoride.

The emission strength indicated for Comparison Example 4 in parenthesis is that determined before the heat treatment under atmospheric conditions.

As is clear from the results shown in Table 3, each of the SMS phosphors (Examples 5 to 8) which were heat-treated in the presence of ammonium fluoride according to the invention gives an emission of high emission strength under excitation with ultraviolet rays having wavelength of 400 nm after heat treatment under atmospheric conditions, as compared with the SMS phosphor (Comparison Example 4) having been not heat-treated in the presence of ammonium fluoride.

Example 9

Ratio of Weight Increase Caused by Moisture Absorption of Blue Light-Emitting SMS Phosphor Having Coating Layer Comprising Fluorine-Containing Compound The three portions of 2 g of the blue light-emitting SMS phosphor obtained in Example 2 by heating 100 weight parts of SMS phosphor in the presence of 5.0 weight parts ammonium fluoride were taken and kept in a thermohygrostat at the temperature of 30° C., 80% R.H. for 24 hours, 48 hours and 72 hours, respectively. Thereafter, each of the SMS phosphor was heated at 1,000° C. for one hour, and decrease of its weight was determined. The ratio of moisture absorption was calculated by deducing the weight decrease determined after the heat treatment at 1,000° C. for one hour from the weight of the SMS phosphor before subjecting to the treatment in the thermohygrostat. The results are set forth in Table 4.

Comparison Example 5

Ratio of Weight Increase Caused by Moisture Absorption of Blue Light-Emitting SMS Phosphor Having No Coating Layer The blue light-emitting SMS phosphors (with no treatment using ammonium fluoride) prepared in Example 1(1) were taken and kept in the thermohygrostat at the temperature of 30° C., 80% R.H. for 24 hours, 48 hours and 72 hours, respectively, in the same manner as described in Example 9. Thereafter, the ratio of moisture absorption was calculated. The results are set forth in Table 4.

TABLE 4

|  | After 24 hrs. | After 48 hrs. | After 72 hrs. |
| --- | --- | --- | --- |
| Example 9 | 0.01 wt. % or less | 0.11 wt. % | 0.08 wt. % |
| Com. Ex. 5 | 0.32 wt. % | 0.64 wt. % | 0.88 wt. % |

As is clear from the results shown in Table 4, the SMS phosphor (Example 9) which has been heat-treated in the presence of ammonium fluoride according to the invention shows low weight increase caused by moisture absorption, as compared with the SMS phosphor (Comparison Example 5).

Example 10

Analysis of Components of Coating Layer Comprising Fluorine-Containing Compound

The procedures of Example 1 were repeated except that ammonium fluoride was used in an amount of 2.0 weight parts per 100 weight parts of the SMS phosphor, in the procedures of (2) for heat treatment in the presence of ammonium fluoride.

By observing the surface of the thus heat-treated SMS phosphor by means of TEM (using field emission transmitting electron microscope), it was confirmed that a coating layer was formed on the surface of the SMS phosphor. The coating layer on the SMS phosphor was analyzed by means of EDS (UTW type energy dispersing X ray analyzer, available from NORAN) and a detector of Si(Li) semiconductor detector) under such condition that the beam diameter was 1 nm. Sr and F were mainly detected. Further, X ray refraction pattern of the SMS phosphor was obtained under the below-mentioned conditions. The peak assignable to $SrF_2$ was found.

In addition, the SMS phosphor which was heat-treated in the presence of 20.0 weight parts of ammonium fluoride per 100 weight parts of the phosphor in Comparison Example 2 was analyzed by obtaining X ray diffraction pattern. The peak assignable to $SrF_2$ was found.

In view of these observations, it was assumed that ammonium fluoride was decomposed by the heat treatment, and F produced in the decomposed gaseous ammonium fluoride reacted with Sr present on the surface of the SMS phosphor, to produce a coating layer containing $SrF_2$.

[Conditions for Obtaining the X-Ray Diffraction Pattern]
Measurement: Continuous measurement
X-ray source: CuKα
Tube voltage: 40 kV
Tube current: 40 mA
Divergent slit width: ½ deg
Scattering slit width: ½ deg
Light-receiving slit width: 0.30 mm
Scan speed: 2 deg/min.
Scan step: 0.02 deg Example 11

Production of Green Light-Emitting Silicate Phosphor Having Coating Layer Comprising Fluorine-containing Compound, and Evaluation on its Moisture Resistance (1) Preparation of Green Light-Emitting Silicate Phosphor of $(Sr,Ba)_2SiO_4:Eu$ Powdery strontium carbonate (purity: 99.99 wt. %, mean particle size: 2.73 μm), powdery barium carbonate (purity: 99.8 wt. %, mean particle size: 1.26 μm), powdery silicon dioxide (purity: 99.9 wt. %, mean particle size: 3.87 μm), powdery europium oxide (purity: 99.9 wt. %, mean particle size: 2.71 μm), and powdery strontium chloride (purity: 99.9 wt. %) were taken in a molar ratio of 0.945:1:1.000:0.0200:0.015 for $SrCO_3:BaCO_3:SiO_2:Eu_2O_3:SrCl_2$, respectively. The mean particle size of each powder was determined by the laser diffraction scattering method.

All of the powdery materials were placed in a ball mill together with pure water and mixed under wet conditions for 24 hours, to give a slurry of the powdery mixture. The slurry was dried by means of a spray dryer to obtain a powdery mixture having a mean particle size of 40 μm. The obtained powdery mixture was washed with water, and dried. The dry powdery mixture was placed in an alumina crucible and calcined by heating to 800° C. for 3 hours under atmospheric conditions. The calcined mixture was allowed to stand at room temperature. The mixture was then calcined by heating to 1,200° C. for 6 hours under an atmosphere of a gaseous mixture of 2 vol. % hydrogen-98 vol. % argon. The calcined mixture was allowed to stand at room temperature, to give a powdery calcined product. The powdery calcined product was washed with water and dried.

X ray diffraction pattern of the dried powdery calcined product indicated that the calcined product had the crystal structure assignable to $(Sr,Ba)_2SiO_4$. Further, it was confirmed that the calcined product emitted a green light upon irradiation with ultraviolet rays having wavelength of 400 nm.

Accordingly, it was confirmed that the calcined product was a green light-emitting silicate phosphor having a constitutional formula of $Sr_{0.96}BaSiO_4:Eu^{2+}{}_{0.04}$.

(2) Heat Treatment in the Presence of Ammonium Fluoride (Formation of Coating Layer Comprising Fluorine-Containing Compound)

100 weight parts of the silicate phosphor prepared in (1) above were mixed with 5 weight parts of ammonium fluoride. The mixture was placed in an alumina crucible. The crucible was covered with a lid, and heated to 500° C. for 6 hours under atmospheric conditions, and allowed to stand at room temperature. The emission strength of the obtained silicate phosphor was determined in the above-mentioned manner using ultraviolet rays having wavelength of 400 nm. The results are set forth in Table 5.

The silicate phosphor heat-treated in the presence of ammonium fluoride was sectioned. The section of the surface of the phosphor was observed by means of TEM, and it was confirmed that a coating layer was formed on the surface of the phosphor.

(3) Determination of Thickness of Coating Layer Comprising Fluorine-Containing Compound The fluorine-content in the surface layer of the phosphor was continuously detected by means of EDS and Si(Li) semiconductor detector (beam diameter: 1 nm) observing the conditions of section of the surface area of the phosphor. The thickness of the coating layer was determined by the depth from the surface of the phosphor at which the fluorine content reached to 20 atomic % or less. The results are set forth in Table 5.

(4) Determination of Emission Strength after Keeping in High Humid Atmosphere (Evaluation of Moisture Resistance)

The green light-emitting silicate phosphor heat-treated in the presence of ammonium fluoride was kept in a thermohygrostat at 60° C., 90% R.H., for 720 hours. Subsequently, the emission strength of the silicate phosphor observed upon excitation with ultraviolet rays having wavelength of 400 nm was measured. The results are set forth in Table 5.

Comparison Example 6

Production of Green Light-Emitting Silicate Phosphor Having Coating Layer Comprising Fluorine-Containing Compound, and Evaluation on its Moisture Resistance The procedures of Example 11 were repeated except that ammonium fluoride was used in an amount of 20.0 weight parts per 100 weight parts of the silicate phosphor in the procedures of (2) for heat treatment in the presence of ammonium fluoride.

The emission strength, thickness of the coating layer and emission strength after keeping under high humid conditions were determined in the same manner as described in Example 11. The results are set forth in Table 5.

Comparison Example 7

Evaluation of Moisture Resistance Of Green-Light Emitting Silicate Phosphor

A green light-emitting silicate phosphor was prepared in the same manner as described in Example 11(1) for the preparation of $(Sr,Ba)_2SiO_4:Eu$ phosphor.

The emission strength of the phosphor after keeping under high humid atmosphere was determined in the same manner as described in Example 11. The results are set forth in Table 5.

TABLE 5

| | $NH_4F$ | Coating | Emission strength | |
|---|---|---|---|---|
| | (weight parts) | (nm) | $NH_4$-heating | Humid condition |
| Example 11 | 5.0 | 600 | 98 | 94 |
| Com. Ex. 6 | 20.0 | 1600 | 86 | 86 |
| Com. Ex. 7 | — | — | (100) | 5 |

Remarks:

$NH_4$-heating: Emission strength after the heat treatment in the presence of ammonium fluoride ($NH_4F$)

Humid condition: Emission strength after keeping under high humid condition

Amount of $NH_4F$ is per 100 weight parts of silicate phosphor.

Emission strength is a value relative to 100 of the initial emission strength which was observed on the silicate phosphor prior to the treatment under high humid conditions.

The emission strength indicated for Comparison Example 7 in parenthesis is that determined before keeping under high humid conditions.

As is clear from the results shown in Table 5, each of the green light-emitting silicate phosphors (Example 11 & Comparison Example 6) which were heat-treated in the presence of ammonium fluoride gives an emission of high emission strength after keeping under high humid conditions, as compared with the green light-emitting silicate phosphor (Comparison Example 7) having been not heat-treated in the presence of ammonium fluoride. This means that the former phosphors show high moisture strength.

In addition, the silicate phosphor having a coating layer of 600 nm thick (Example 11) gives emission higher than the silicate phosphor having a coating layer of 1,600 nm (Comparison Example 6) by approx. 10%.

Example 12

Production of Green Light-Emitting Silicate Phosphor Having Coating Layer Comprising Fluorine-containing Compound (1) Preparation of Green Light-Emitting Silicate Phosphor of $Ba_2SiO_4:Eu$ Powdery barium carbonate (purity: 99.8 wt. %, mean particle size: 1.26 μm), powdery silicon dioxide (purity: 99.9 wt. %, mean particle size: 3.87 μm), powdery europium oxide (purity: 99.9 wt. %, mean particle size: 2.71 μm), and powdery barium chloride (purity: 99.9 wt. %) were taken in a molar ratio of 1.945:1:0.020:0.0200:0.015 for $BaCO_2$:$SiO_2$: $Eu_2O_2$:$SrCl_2$, respectively. The mean particle size of each powder was determined by the laser diffraction scattering method.

All of the powdery materials were placed in a ball mill together with pure water and mixed under wet conditions for 24 hours, to give a slurry of the powdery mixture. The slurry was dried by means of a spray dryer to obtain a powdery mixture having a mean particle size of 40 μm. The obtained powdery mixture was washed with water, and dried. The dry powdery mixture was placed in an alumina crucible and calcined by heating to 800° C. for 3 hours under atmospheric conditions. The calcined mixture was allowed to stand at room temperature. The mixture was then calcined by heating to 1,200° C. for 6 hours under an atmosphere of a gaseous mixture of 2 vol. % hydrogen-98 vol. % argon. The calcined mixture was allowed to stand at room temperature, to give a powdery calcined product. The powdery calcined product was washed with water and dried.

X ray diffraction pattern of the dried powdery calcined product indicated that the calcined product had the crystal structure assignable to the desired $Ba_2SiO_4$. Further, it was confirmed that the calcined product emits a green light upon irradiation with ultraviolet rays having wavelength of 400 nm.

Accordingly, it was confirmed that the calcined product was a green light-emitting silicate phosphor having a constitutional formula of $Ba_{1.96}SiO_4$:$Eu^{2+}_{0.04}$.

(2) Heat Treatment in the Presence of Ammonium Fluoride 100 weight parts of the silicate phosphor prepared in (1) above were mixed with 5 weight parts of ammonium fluoride. The mixture was placed in an alumina crucible. The crucible was covered with a lid, and heated to 500° C. for 6 hours under atmospheric conditions, and allowed to stand at room temperature. The emission strength of the obtained silicate phosphor was determined in the above-mentioned manner using ultraviolet rays having wavelength of 400 nm. The emission strength was 98, relative to 100 for the emission strength observed on the same phosphor having been not to subjected to heat treatment in the presence of ammonium fluoride. Thus, there was seen no essential difference on the emission strength of the phosphor before and after the heat treatment in the ammonium fluoride.

Example 13

Production of Red Light-Emitting Silicate Phosphor Having Coating Layer Comprising Fluorine-Containing Compound (1) Preparation of Red Light-Emitting Silicate Phosphor of $Ba_3MgSi_2O_8$:Eu,Mn Powdery barium carbonate (purity: 99.8 wt. %, mean particle size: 1.26 μm), powdery magnesium oxide (prepared by gas phase oxidation, purity: 99.98 wt. %, particle size calculated from BET specific surface area: 0.2 μm), powdery silicon dioxide (purity: 99.9 wt. %, mean particle size: 3.87 μm), powdery barium chloride (purity: 99 wt. %), powdery europium oxide (purity: 99.9 wt. %, mean particle size: 2.71 μm), and powdery manganese monoxide (purity: 99.9 wt. %) were taken in a molar ratio of 2.705:0.125:1:2.000:0.035: 0.100 for $BaCO_3$:$BaCl_2$:MgO:$SiO_2$:$Eu_2O_3$:MnO, respectively. The mean particle size of each powder (except for powdery magnesium oxide) was determined by the laser diffraction scattering method.

All of the powdery materials were placed in a ball mill together with pure water and mixed under wet conditions for 24 hours, to give a slurry of the powdery mixture. The slurry was spray-dried by means of a spray dryer to obtain a powdery mixture having a mean particle size of 40 μm. The obtained powdery mixture was washed with water, and dried. The dry powdery mixture was placed in an alumina crucible and calcined by heating to 800° C. for 3 hours under atmospheric conditions. The calcined mixture was allowed to stand at room temperature. The mixture was then calcined by heating to 1,200° C. for 6 hours under an atmosphere of a gaseous mixture of 2 vol. % hydrogen-98 vol. % argon. The calcined mixture was allowed to stand at room temperature, to give a powdery calcined product. The powdery calcined product was washed with water and dried.

X ray diffraction pattern of the dried powdery calcined product indicated that the calcined product had the crystal structure assignable to the desired $Ba_3MgSi_2O_8$. Further, it was confirmed that the calcined product emitted a red light upon irradiation with ultraviolet rays having wavelength of 400 nm.

Accordingly, it was confirmed that the calcined product was a red light-emitting silicate phosphor having a constitutional formula of $Ba_{2.830}MgSi_2O_8$: $Eu^{2+}_{0.070}Mn^{2+}_{0.100}$.

(2) Heat Treatment in the Presence of Ammonium Fluoride 100 weight parts of the silicate phosphor prepared in (1) above were mixed with 5 weight parts of ammonium fluoride. The mixture was placed in an alumina crucible. The crucible was covered with a lid, and heated to 500° C. for 6 hours under atmospheric conditions, and allowed to stand at room temperature. The emission strength of the obtained silicate phosphor was determined in the above-mentioned manner using ultraviolet rays having wavelength of 400 nm. The results are set forth in Table 6.

The silicate phosphor heat-treated in the presence of ammonium fluoride was sectioned. The section of the surface are of the phosphor was observed by means of TEM, and it was confirmed that a coating layer was formed on the surface of the phosphor.

(3) Determination of Thickness of Coating Layer Comprising Fluorine-Containing Compound The fluorine content in the surface layer of the phosphor was detected in the same manner as described in Example 11. The results are set forth in Table 6.

(4) Determination of Emission Strength after Keeping Under High Humid Atmosphere (Evaluation on Moisture Resistance)

The red light-emitting silicate phosphor heat-treated in the presence of ammonium fluoride was kept in a thermohygrostat at 60° C., 90% R.H., for 720 hours. Subsequently, the emission strength of the silicate phosphor observed upon excitation with ultraviolet rays having wavelength of 400 nm was measured. The results are set forth in Table 6.

Comparison Example 8

Production of Red Light-Emitting Silicate Phosphor Having Coating Layer Comprising Fluorine-Containing Compound, and Evaluation on its Moisture Resistance The procedures of Example 13 were repeated except that ammonium fluoride was used in an amount of 20.0 weight parts per 100 weight parts of the silicate phosphor in the procedures of (2) for heat treatment in the presence of ammonium fluoride.

The emission strength of the phosphor after the heat treatment in the presence of ammonium fluoride and emission strength of the phosphor after keeping under high humid conditions were determined in the same manner as described in Example 13. The results are set forth in Table 6.

Comparison Example 9

Evaluation of Moisture Resistance of Red Light-Emitting Silicate Phosphor Having No Coating Layer A red light-emitting silicate phosphor was prepared in the same manner as described in Example 13(1) for the preparation of $Ba_3MgSi_2O_8$:Eu,Mn phosphor.

The emission strength of the phosphor after the heat treatment in the presence of ammonium fluoride and emission strength of the phosphor after keeping under high humid conditions were determined in the same manner as described in Example 13. The results are set forth in Table 6.

TABLE 6

| | $NH_4F$ | Coating | Emission strength | |
|---|---|---|---|---|
| | (weight parts) | (nm) | $NH_4$-heating | Humid condition |
| Example 13 | 5.0 | 100 | 87 | 87 |
| Com. Ex. 8 | 20.0 | — | 60 | 60 |
| Com. Ex. 9 | — | — | (100) | 15 |

Remarks:

$NH_4$-heating: Emission strength after the heat treatment in the presence of ammonium fluoride ($NH_4F$)

Humid condition: Emission strength after keeping under high humid condition

Amount of $NH_4F$ is per 100 weight parts of silicate phosphor.

Emission strength is a value relative to 100 of the initial emission strength which was observed on the silicate phosphor prior to the treatment under high humid conditions.

The emission strength indicated for Comparison Example 9 in parenthesis is that determined before keeping under high humid conditions.

As is understood from the results shown in Table 6, the moisture resistance of the red light-emitting silicate phosphor also is improved by the heat-treatment in the presence of ammonium fluoride whereby forming a coating layer. Further, it is understood that the use of an excessive amount of ammonium fluoride makes the emission strength lower.

Example 14

The procedures of Example 13 were repeated except that the temperature for heating was changed to 400° C. in the step (2), to treat the red light-emitting silicate phosphor in the presence of ammonium fluoride.

The emission strength of the silicate phosphor after heat treatment in the presence of ammonium fluoride was determined in the same manner as described in Example 13. The emission strength was 110, relative to 100 for the emission strength of the same phosphor prior to the heat treatment in the presence of ammonium fluoride.

Example 15

Production of Blue Light-Emitting Silicate Phosphor Having Coating Layer Comprising Fluorine-Containing Compound, and Evaluation on its Moisture Resistance (1) Preparation of Blue Light-Emitting $Sr_3MgSi_2O_3$:Eu,Y Phosphor Powdery strontium carbonate ($SrCO_3$, purity: 99.7 wt. %, mean particle size: 0.9 μm), powdery strontium chloride hexahydrates ($SrCl_2 \cdot 6H_2O$), powdery europium oxide ($Eu_2O_3$, purity: 99.9 wt. %, mean particle size: 2.7 μm), powdery scandium ($Sc_2O_3$, purity: 99.9 wt. %), powdery magnesium oxide (prepared by gas phase oxidation, purity: 99.98 wt. %, particle size calculated from BET specific surface area: 0.2 μm) and powdery silicon dioxide (purity: 99.9 wt. %, particle size calculated from BET specific surface area: 0.01 μm 3.87 μm) were taken in a molar ratio of 2.800:0.125: 0.035:0.0025:1:2.000 for $SrCO_3$:$SrCl_2 \cdot 6H_2O$:$Eu_2O_3$:$Sc_2O_3$: MgO:$SiO_2$, respectively.

All of the powdery materials were placed in a ball mill together with water and mixed under wet conditions for 24 hours, to give a slurry of the powdery mixture. The slurry was dried by means of a spray dryer to obtain a powdery mixture having a mean particle size of 40 μm. The dry powdery mixture was placed in an alumina crucible and calcined by heating to 800° C. for 3 hours under atmospheric conditions. The calcined mixture was allowed to stand at room temperature. The mixture was then calcined by heating to 1,200° C. for 3 hours in an atmosphere of a gaseous mixture of 2 vol. % hydrogen-98 vol. % argon. The calcined mixture was allowed to stand at room temperature, to give a blue light-emitting silicate phosphor having formula of $Sr_{2.925}MgSi_2O_8$: $Eu^{2+}{}_{0.070}Y^{2+}{}_{0.005}$.

(2) Heat Treatment in the Presence of Ammonium Fluoride (Formation of Coating Layer Comprising Fluorine-Containing Compound)

100 weight parts of the blue light-emitting silicate phosphor prepared in (1) above were mixed with 5 weight parts of ammonium fluoride. The mixture was placed in an alumina crucible. The crucible was covered with a lid, and heated to 500° C. for 6 hours under atmospheric conditions, and allowed to stand at room temperature. The emission strength of the obtained silicate phosphor was determined in the above-mentioned manner using ultraviolet rays having wavelength of 400 nm. The results are set forth in Table 7.

The phosphor heat-treated in the presence of ammonium fluoride was sectioned. The section of the surface are of the phosphor was observed by means of TEM, and it was confirmed that a coating layer was formed on the surface of the phosphor.

(3) Determination of Thickness of Coating Layer Comprising Fluorine-Containing Compound The thickness of the coating layer was determined in the same manner as described in Example 11.

(4) Determination of Emission Strength after Keeping in High Humid Atmosphere (Evaluation of Moisture Resistance)

The silicate phosphor heat-treated in the presence of ammonium fluoride was kept in a thermohygrostat at 60° C., 90% R.H., for 720 hours. Subsequently, the emission strength of the silicate phosphor observed upon excitation with ultraviolet rays having wavelength of 400 nm was measured. The results are set forth in Table 7.

Comparison Example 10

Production of Blue Light-Emitting Silicate Phosphor Having Coating Layer Comprising Fluorine-Containing Compound, and Evaluation on its Moisture Resistance The procedures of Example 15 were repeated except that ammonium fluoride was used in an amount of 20.0 weight parts per 100 weight parts of the silicate phosphor in the procedures of (2) for heat treatment in the presence of ammonium fluoride.

The emission strength of the phosphor after the heat treatment in the presence of ammonium fluoride and emission strength of the phosphor after keeping under high humid conditions were determined in the same manner as described in Example 15. The results are set forth in Table 7.

Comparison Example 11

Production of Blue Light-Emitting Silicate Phosphor Having No Coating Layer and Evaluation on its Moisture Resistance A blue light-emitting silicate phosphor was prepared in the same manner as described in Example 15(1) for the preparation of $Sr_3MgSi_2O_8$:Eu,Y phosphor.

The emission strength of the phosphor after keeping under high humid conditions was determined in the same manner as described in Example 15. The results are set forth in Table 7.

TABLE 7

| | $NH_4F$ | Coating | Emission strength | |
| --- | --- | --- | --- | --- |
| | (weight parts) | (nm) | $NH_4$-heating | Humid condition |
| Example 15 | 5.0 | 60 | 100 | 103 |
| Com. Ex. 10 | 20.0 | — | 94 | 94 |
| Com. Ex. 11 | — | — | (100) | 85 |

Remarks:

$NH_4$-heating: Emission strength after the heat treatment in the presence of ammonium fluoride ($NH_4F$)

Humid condition: Emission strength after keeping under high humid condition

Amount of $NH_4F$ is per 100 weight parts of silicate phosphor.

Emission strength is a value relative to 100 of the initial emission strength which was observed on the silicate phosphor prior to the treatment under high humid conditions.

The emission strength indicated for Comparison Example 11 in parenthesis is that determined before keeping under high humid conditions.

As is understood from the results shown in Table 7, the moisture resistance of the blue light-emitting silicate phosphor is improved by the heat-treatment in the presence of ammonium fluoride whereby forming a coating layer. Further, it is understood that the use of an excessive amount of ammonium fluoride makes the emission strength lower.

EXPLANATION OF SYMBOLS

1 substrate
2 adhesive
3 light-emitting semiconductor element
4a,4b electrode
5a,5b lead wire
6 resinous layer
7 phosphor layer
8 light-reflecting material
9a,9b conductive wire

What is claimed is:

1. A silicate phosphor having a coating layer comprising a fluorine-containing compound on its surface which is obtained by heating a mixture comprising a silicate phosphor and ammonium fluoride in an amount of 0.5 to 15 weight parts per 100 weight parts of the silicate phosphor at a temperature in the range of 200 to 600° C.

2. The silicate phosphor having a coating layer comprising a fluorine-containing compound according to claim 1, wherein the mixture comprises 1 to 10 weight parts of ammonium fluoride per 100 weight parts of the silicate phosphor.

3. The silicate phosphor having a coating layer comprising a fluorine-containing compound according to claim 1, wherein the silicate phosphor is selected from the group consisting of a blue light-emitting silicate phosphor having formula of $(Ba,Sr,Ca)_3MgSi_2O_8$:A in which A is an activating element, a green light-emitting silicate phosphor having formula of $(Ba,Sr,Ca)_2SiO_4$:B in which B is an activating element, and a red light-emitting silicate phosphor having formula of $(Ba,Sr,Ca)_3MgSi_2O_8$:Eu,Mn.

4. The silicate phosphor having a coating layer comprising a fluorine-containing compound according to claim 1, wherein the coated silicate phosphor emits a visible light in response to excitation with a light having a wavelength of 400 nm after being kept under such conditions as 720 hours, at 60° C., R.H. 90%, said visible light having an emission peak at which the emission shows strength as much as 0.85 to 1.5 times the strength of emission given by the same silicate phosphor but having no coating layer after being kept under the same conditions.

5. A silicate phosphor having a coating layer comprising a fluorine-containing compound on its surface, wherein the coating layer has a thickness in the range of 30 to 1,500 nm.

6. The silicate phosphor having a coating layer comprising a fluorine-containing compound according to claim 5, wherein the silicate phosphor is a blue light-emitting silicate phosphor having formula of $(Ba,Sr,Ca)_3MgSi_2O_8$:A in which A is an activating element and the coating layer has thickness in the range of 30 to 150 nm.

7. The silicate phosphor having a coating layer comprising a fluorine-containing compound according to claim 5, wherein the silicate phosphor is a green light-emitting silicate phosphor having formula of $(Ba,Sr,Ca)_2SiO_4$:B in which B is an activating element and the coating layer has thickness in the range of 100 to 800 nm.

8. The silicate phosphor having a coating layer comprising a fluorine-containing compound according to claim 5, wherein the silicate phosphor is a red light-emitting silicate phosphor having formula of $(Ba,Sr,Ca)_3MgSi_2O_8$:Eu,Mn and the coating layer has thickness in the range of 30 to 300 nm.

9. A light-emitting device comprising a semiconductor element emitting a light having the wavelength region in the range of 350 to 430 nm and a phosphor-containing resin composition comprising a blue light-emitting phosphor, a green light-emitting phosphor and a red light-emitting phosphor, all of which emit the light in response to excitation with the light emitted by the semiconductor element, dispersed in a resinous binder, wherein at least the blue light-emitting phosphor is a silicate phosphor having a coating layer comprising a fluorine-containing compound on its surface which is obtained by heating a mixture comprising a silicate phosphor and ammonium fluoride in an amount of 0.5 to 15 weight parts per 100 weight parts of the silicate phosphor at a temperature in the range of 200 to 600° C.

10. The light-emitting device according to claim 9, wherein the green light-emitting phosphor is also a silicate phosphor having a coating layer comprising a fluorine-containing compound on its surface which is obtained by heating a mixture comprising a silicate phosphor and ammonium fluoride in an amount of 0.5 to 15 weight parts per 100 weight parts of the silicate phosphor at a temperature in the range of 200 to 600° C.

11. The light-emitting device according to claim 9, wherein the red light-emitting phosphor is also a silicate phosphor having a coating layer comprising a fluorine-containing compound on its surface which is obtained by heating a mixture comprising a silicate phosphor and ammonium fluoride in an amount of 0.5 to 15 weight parts per 100 weight parts of the silicate phosphor at a temperature in the range of 200 to 600° C.

12. A light-emitting device comprising a semiconductor element emitting a light having the wavelength region in the range of 350 to 430 nm and a phosphor-containing resin composition comprising a blue light-emitting phosphor, a green light-emitting phosphor and a red light-emitting phosphor, all of which emit the light in response to excitation with the light emitted by the semiconductor element, dispersed in a resinous binder, wherein at least the blue light-emitting phosphor is a silicate phosphor having a coating layer comprising a fluorine-containing compound on its surface and the coating layer has thickness in the range of 30 to 1,500 nm.

13. The light-emitting device according to claim 12, wherein the green light-emitting silicate phosphor also has a coating layer comprising a fluorine-containing compound on its surface and the coating layer has thickness in the range of 30 to 1,500 nm.

14. The light-emitting device according to claim 12, wherein the red light-emitting silicate phosphor also has a coating layer comprising a fluorine-containing compound on its surface and the coating layer has thickness in the range of 30 to 1,500 nm.

* * * * *